United States Patent
Forck

(10) Patent No.: US 6,376,969 B1
(45) Date of Patent: Apr. 23, 2002

(54) APPARATUS AND METHOD FOR PROVIDING TEMPERATURE COMPENSATION OF A PIEZOELECTRIC DEVICE

(75) Inventor: Glen F. Forck, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 09/777,100

(22) Filed: Feb. 5, 2001

(51) Int. Cl.[7] .......................................... H01L 41/053
(52) U.S. Cl. ........................ 310/346; 310/353; 310/354
(58) Field of Search .................... 310/354, 346, 310/353

(56) References Cited

U.S. PATENT DOCUMENTS

| | | | |
|---|---|---|---|
| 4,796,141 A | * 1/1989 | Tsumura | 360/135 |
| 5,059,850 A | * 10/1991 | Yoshimura et al. | 310/328 |
| 5,111,101 A | * 5/1992 | Imoto | 310/328 |
| 5,374,911 A | * 12/1994 | Kich et al. | 333/209 |
| 5,388,751 A | * 2/1995 | Harada et al. | 228/4.5 |
| 5,471,721 A | 12/1995 | Haertling | 29/25.35 |
| 5,632,841 A | 5/1997 | Hellbaum et al. | 156/245 |
| 5,790,156 A | 8/1998 | Mutton et al. | 347/47 |
| 5,796,206 A | 8/1998 | Asai et al. | 310/317 |
| 5,810,255 A | 9/1998 | Itoh et al. | 239/102.2 |
| 5,907,211 A | 5/1999 | Hall et al. | 310/328 |

* cited by examiner

Primary Examiner—Thomas M. Dougherty
(74) Attorney, Agent, or Firm—Wood, Herron & Evans, LLP

(57) ABSTRACT

A clamping device for providing temperature compensation of a piezoelectric device, such as a thermally pre-stressed bending actuator. The clamping device is configured to apply a variable clamping force to the piezoelectric device that varies in response to temperature changes proximate the piezoelectric device. The variable clamping force applied to the piezoelectric device alters its operating characteristics to provide temperature compensation of the device.

21 Claims, 1 Drawing Sheet

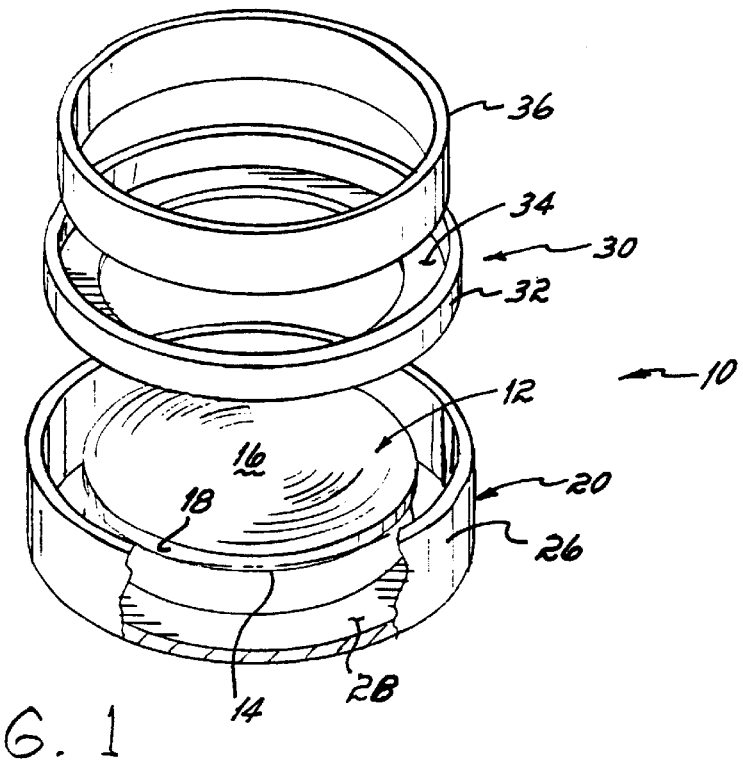
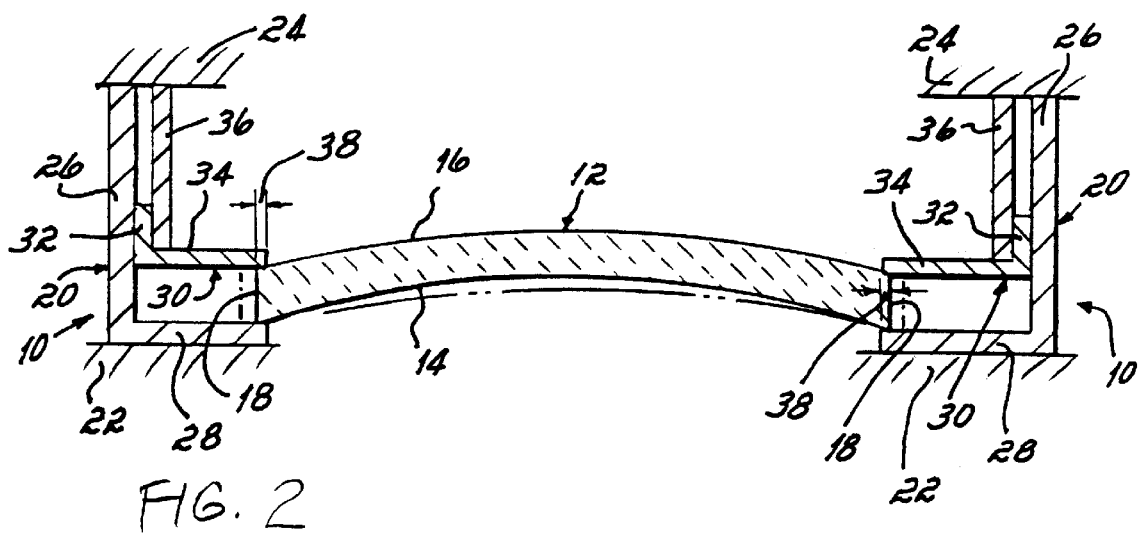

APPARATUS AND METHOD FOR PROVIDING TEMPERATURE COMPENSATION OF A PIEZOELECTRIC DEVICE

TECHNICAL FIELD

This invention relates generally to piezoelectric devices and, more particularly, to an apparatus and method for providing temperature compensation of a piezoelectric device to vary its operating characteristics in response to changes in temperature proximate the device.

BACKGROUND

Piezoelectric devices alter their shape in response to an applied electric field. An electric field applied in the direction of polarization effects an expansion of the piezoelectric material in the same direction, while a voltage applied in the opposite direction of polarization will cause a contraction of the material in that same direction. Piezoelectric bending actuators, such as thermally pre-stressed bending actuators, use the "bending" action of the actuator to convert electrical energy into mechanical energy. Several different high performance bending devices or actuators have been developed, such as those disclosed in U.S. Pat. Nos. 5,471,721 and 5,632,841 to which the reader is referred.

Due to the nature of their construction, however, the performance of piezoelectric devices is temperature dependent and presents a problem in applications having a broad range of operating temperatures, such as 0° C. to 100° C., for example. In this and other wide temperature ranges, piezoelectric devices may have force and displacement characteristics that change in response to changes in temperature of the device. Thus, a piezoelectric device that has a given axial displacement at one temperature may have a different displacement at a different temperature.

In response to an applied voltage, the piezoelectric device will change in shape by a predetermined axial displacement and apply a predetermined force or load at that temperature. However, these characteristics will also change at a different temperature of the piezoelectric device. Therefore, the piezoelectric device should be temperature compensated to provide a consistent, reliable and predictable movement or displacement and force in response to an applied voltage over a broad temperature range.

In the past, piezoelectric devices have been temperature compensated by mechanical means, such as by hydraulic and mechanical compensation, and by special compensating materials. However, these compensating methods can add cost and complexity, and increase the overall size of the piezoelectric device.

SUMMARY OF THE INVENTION

While the invention will be described in connection with certain embodiments, it will be understood that the invention is not limited to these embodiments. On the contrary, the invention includes all alternatives, modifications and equivalents as may be included within the spirit and scope of the present invention.

A clamping device provides temperature compensation of a piezoelectric device having first and second opposed surfaces and a peripheral edge extending therebetween. The clamping device is configured to engage the first and second opposed surfaces of the piezoelectric device proximate the peripheral edge, and is operable to apply a variable clamping force to the piezoelectric device. A temperature responsive device is coupled with the clamping device and is operable to vary the applied clamping force in response to changes in temperature proximate the piezoelectric device. The variable clamping force alters operating characteristics of the piezoelectric device to provide temperature compensation of the piezoelectric device.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

FIG. 1 is a disassembled perspective view illustrating a clamping device in accordance with one embodiment of the present invention for providing temperature compensation of a piezoelectric device; and FIG. 2 is a cross-sectional view of the assembled clamping device of FIG. 1.

DETAILED DESCRIPTION

With reference to the figures, a clamping device 10 is illustrated in accordance with one embodiment of the present invention for providing temperature compensation of a piezoelectric device 12. Piezoelectric device 12 is preferably a thermally pre-stressed bending device or actuator having a domed configuration as known in the art and including opposed major surfaces 14 and 16 and a peripheral edge 18 extending therebetween. In one embodiment of the present invention, the piezoelectric device 12 includes an electroactive layer (not shown) positioned between a pair of electrodes (not shown). When the electrodes are energized, the applied voltage causes the electroactive layer to bend, typically by flattening out from the domed configuration, although an increased doming is also possible. While the piezoelectric device 12 is illustrated as having a cylindrical or disk configuration, it will be appreciated that other shapes of device 12, such as a rectangular or other geometric configuration, are possible without departing from the spirit and scope of the present invention. Similarly, although the piezoelectric device 12 is shown as being domed upwards in FIG. 2, it could be domed downward in other embodiments of the invention. As will be described in detail below, the clamping device 10 may be configured to engage the opposed surfaces 14, 16 of the piezoelectric device 12 generally proximate the peripheral edge 18 to apply a clamping force that varies in response to temperature changes proximate the piezoelectric device 12. The variable clamping force applied to piezoelectric device 12 may alter its operating characteristics to provide temperature compensation of the device 12.

In one embodiment of the present invention, clamping device 10 includes an outer clamping member 20 that is typically mounted between opposing fixed supports 22 and 24 by any of a variety of ways known to those skilled in the art. In other embodiments of the invention, the fixed support 22 may be eliminated. The outer clamping member 20 has an upstanding wall 26 and an inwardly extending support flange 28. In those applications wherein the piezoelectric device 12 comprises a cylinder or disk configuration as illustrated in the figures, the outer clamping member 20 typically comprises an annular ring formed by the upstanding wall 26 and the inwardly extending support flange 28. Those of ordinary skill in the art will readily appreciate that outer clamping member 20 may be modified from an annular ring configuration depending on the peripheral configuration or shape of the piezoelectric device 12. For example, the outer clamping member 20 may be modified to have a rectangular configuration in those applications wherein the piezoelectric device 12 has a rectangular peripheral shape. In other embodiments of the invention, the outer clamping member 20 may engage only a portion of the periphery of the piezoelectric device 12, e.g., a portion of a ring or rectangle. In these instances, the outer clamping member 20 may be appropriately configured, e.g., a portion of a ring or rectangle. The outer clamping member 20 is typically configured to receive the piezoelectric device 12 so that the upstanding wall 26 surrounds the peripheral edge 18 and the support flange 28 engages surface 14 of the device 12 proximate the peripheral edge 18.

Clamping device 10 further includes an inner clamping member 30 that is mounted for movement relative to the outer clamping member 20. The inner clamping member 30 typically has an upstanding wall 32 and an inwardly extending support flange 34, although other configurations known to those skilled in the art may also be used. In one embodiment of the invention, the inner clamping member 30 typically also comprises an annular ring formed by the upstanding wall 32 and the inwardly extending support flange 34 in those applications wherein the piezoelectric device 12 comprises a cylinder or disk configuration as illustrated in the figures, although other configurations complementary to the configuration or shape of the piezoelectric device 12 and outer clamping member 20 are possible. The inner clamping member 30 is typically configured to be positioned within the outer clamping member 20 so that upstanding wall 26 surrounds upstanding wall 32 and support flange 34 engages surface 16 of the piezoelectric device 12 proximate its peripheral edge 18. In other embodiments of the invention, the support flange 34 may engage the surface 16 in other appropriate locations known to those skilled in the art. In its operative position, the support flange 34 of the inner clamping member 30 is generally parallel with the support flange 28 of the outer clamping device 20. The outer and inner clamping members 20, 30 may be made of steel or any other suitable material that has the necessary properties for the particular application of clamping device 10.

As shown in the figures, the clamping device 10 further includes a temperature responsive element 36 that is positioned inwardly of the upstanding walls 26 and 32, and is further positioned to extend between fixed support 24 and the support flange 34 of the inner clamping member 30. In those applications wherein the piezoelectric device 12 comprises a cylinder or disk configuration as illustrated in the figures, the temperature responsive element 36 may comprise an annular wall, although other shapes and configurations of temperature responsive element 36 are possible without departing from the spirit and scope of the present invention. For example, temperature responsive element 36 may comprise multiple circumferentially spaced lugs (not shown) that extend between fixed support 24 and the support flange 34.

In accordance with one embodiment of the invention, the temperature responsive element 36 may be made of aluminum or other suitable material and has an operative length that expands and contracts in response to changes in temperature proximate the piezoelectric device 12. The temperature responsive element 36 is positioned in clamping device 10 to move the outer and inner clamping devices 20, 30 relative to each other for applying a clamping force to the piezoelectric device 12 that varies in response to changes in temperature proximate the piezoelectric device 12.

More particularly, when the temperature responsive element 36 expands in length in response to a change in temperature proximate the piezoelectric device 12, the temperature responsive element 36 moves the support flange 34 of inner clamping member 30 toward the support flange 28 of the outer clamping member 20, thereby applying a load to the inner clamping member 30 that increases the clamping force applied to the piezoelectric device 12 proximate its peripheral edge 18. Conversely, when the temperature responsive element 36 contracts in length in response to a change in temperature proximate the piezoelectric device 12, the temperature responsive element 36 permits the support flange 34 of the inner clamping member 30 to move away from the support flange 28 of the outer clamping member 20, thereby reducing the load applied to the inner clamping member 30 and decreasing the clamping force applied to the piezoelectric device 12 proximate its peripheral edge 18.

The variable clamping force applied by the clamping device 10 may be used to alter operating characteristics of the piezoelectric device 12 and thereby provide temperature compensation of the device 12. More particularly, the piezoelectric device 12 has force and displacement characteristics that change in response to changes in temperature of the device 12. For example, a piezoelectric device has a predetermined initial axial displacement at a specific temperature. In response to an applied voltage, the piezoelectric device will change in shape by a predetermined axial displacement and apply a predetermined force or load at that temperature. However, due to differences in thermal expansion of the materials in the piezoelectric device 12, e.g., metals and ceramics, and changes in $d_{33}$ properties of the piezoelectric device, these axial displacement and load properties of the device will change with temperature.

To provide temperature compensation of the piezoelectric device 12, the temperature responsive element 36 expands or contracts in response to temperature changes proximate the piezoelectric device 12 to increase or decrease the clamping force applied to the piezoelectric device 12 proximate its peripheral edge 18 due to a lever effect between the interface of the device 12 and the support flanges 28, 34 of the clamping device 10. The amount of lever effect is predominantly a function of the amount of contact between the support flange 34 and the piezoelectric device 12, referred to herein as "lever length" and designated generally as numeral 38 in FIG. 2. The "lever length" is generally defined by the radial extent of the piezoelectric device 12 that is clamped between the support flanges 28, 34.

When the applied clamping force is increased due to a change in temperature, i.e., the support flange 34 is moved toward the support flange 28, the clamping device 10 creates a greater clamping load on the piezoelectric device 12 which reduces its displacement for a given applied voltage. Conversely, when the applied clamping force is decreased due to a change in temperature, the support flange 34 is permitted to move away from the support flange 28. In this manner, the clamping device 10 reduces the clamping load on the piezoelectric device 12 which increases its displacement for a given applied voltage. The amount of clamping force applied to the piezoelectric device 12 at a specific temperature is predominantly determined by the length and material chosen for the temperature responsive element 36 and the extent of the lever length 38.

Industrial Applicability

In use, it will be appreciated that the variable clamping force applied by clamping device 10 may provide predictable and reliable temperature compensation of the piezoelectric device 12. The clamping device 10 typically eliminates the need for complex and costly hydraulic and mechanical mechanisms to provide temperature compensation of the piezoelectric device 12.

In response to a change in temperature, such as an increase, proximate the piezoelectric device 12, the clamping device 10 provides an increased clamping force to the device 12 that reduces its displacement for a given applied voltage. Conversely, the clamping device 10 decreases the clamping force applied to the piezoelectric device 12 in response to a change in temperature in the other direction, such as a decrease, proximate the device 12, thereby increasing its displacement for a given applied voltage.

Further, by an appropriate selection of the sizing and thermal expansion and contraction properties of the temperature responsive element 36, as well as the lever length 38, the clamping device 10 may counter-act the changes in force and displacement characteristics of the piezoelectric device 12 in response to changes in temperature. Thus, these characteristics of the piezoelectric device would remain relatively constant regardless of its temperature.

Similarly, in other embodiments of the invention, the clamping device 10 may be configured to diminish the temperature sensitive characteristics of the piezoelectric device 12 without entirely counteracting them.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

Other aspects and features of the present invention can be obtained from a study of the drawings, the disclosure, and the appended claims.

What is claimed is:

1. An apparatus for providing temperature compensation of a piezoelectric device having first and second opposed surfaces and a peripheral edge extending therebetween, comprising:
    a clamping device configured to engage the first and second opposed surfaces of the piezoelectric device proximate the peripheral edge and operable to apply a variable clamping force to the piezoelectric device; and
    a temperature responsive device coupled with the clamping device and operable to vary the applied clamping force in response to changes in temperature proximate the piezoelectric device, wherein the variable clamping force alters operating characteristics of the piezoelectric device to provide temperature compensation of the piezoelectric device.

2. The apparatus of claim 1 wherein the temperature responsive device is operable to increase the clamping force applied by the clamping device to the piezoelectric device in response to one of an increase and a decrease in temperature proximate the piezoelectric device, and further wherein the temperature responsive device is operable to decrease the clamping force applied by the clamping device to the piezoelectric device in response to the other of an increase and a decrease in temperature proximate the piezoelectric device.

3. The apparatus of claim 1 wherein the clamping device comprises:
    a first clamping member operable to engage the first surface of the piezoelectric device; and
    a second clamping member mounted for movement relative to the first clamping member and operable to engage the second surface of the piezoelectric device.

4. The apparatus of claim 3 wherein the first clamping member comprises:
    a first upstanding wall adapted to surround at least a portion of the peripheral edge of the piezoelectric device; and
    a first support flange extending from the first upstanding wall and adapted to engage the first surface of the piezoelectric device proximate the peripheral edge.

5. The apparatus of claim 4 wherein the second clamping member comprises:
    a second upstanding wall positioned adjacent the first upstanding wall of the first clamping member; and
    a second support flange extending from the second upstanding wall and adapted to engage the second surface of the piezoelectric device proximate the peripheral edge.

6. The apparatus of claim 3 wherein the temperature responsive device is coupled with one of the first and second clamping members to cause relative movement therebetween in response to changes in temperature proximate the piezoelectric device.

7. The apparatus of claim 5 wherein the temperature responsive device is positioned inwardly of the first and second upstanding walls.

8. The apparatus of claim 1 wherein the temperature responsive device comprises a member having an operative length that expands and contracts in response to changes in temperature proximate the piezoelectric device.

9. An apparatus for providing temperature compensation of a piezoelectric device having first and second opposed surfaces and a peripheral edge extending therebetween, comprising:
    a first clamping member adapted to engage the first surface of the piezoelectric device;
    a second clamping member mounted for movement relative to the first clamping member and adapted to engage the second surface of the piezoelectric device; and
    a temperature responsive device operatively connected to one of the first and second clamping members and operable to move the first and second clamping members relative to each other for applying a clamping force to the piezoelectric device that varies in response to changes in temperature proximate the piezoelectric device, wherein the variable clamping force alters operating characteristics of the piezoelectric device to provide temperature compensation of the piezoelectric device.

10. The apparatus of claim 9 wherein the first clamping member is positioned to engage the first surface of the piezoelectric device proximate the peripheral edge and the second clamping member is positioned to engage the second surface of the peripheral device proximate the peripheral edge.

11. The apparatus of claim 9 wherein the temperature responsive device is operable to increase the clamping force applied by the first and second clamping members to the piezoelectric device in response to an increase in temperature proximate the piezoelectric device, and further wherein the temperature responsive device is operable to decrease the clamping force applied by the first and second clamping members to the piezoelectric device in response to a decrease in temperature proximate the piezoelectric device.

12. The apparatus of claim 10 wherein the first clamping member comprises a first upstanding wall adapted to surround the peripheral edge of the piezoelectric device and a first support flange extending from the first upstanding wall and adapted to engage the first surface of the piezoelectric device proximate the peripheral edge.

13. The apparatus of claim 12 wherein the second clamping member comprises a second upstanding wall positioned inwardly of the first upstanding wall of the first clamping member and a second support flange extending from the second upstanding wall and adapted to engage the second surface of the piezoelectric device proximate the peripheral edge.

14. The apparatus of claim 13 wherein the temperature responsive device is positioned inwardly of the first and second upstanding walls.

15. The apparatus of claim 9 wherein the temperature responsive device comprises a member having an operative length that extends and contracts in response to changes in temperature proximate the piezoelectric device.

16. A method for providing temperature compensation of a piezoelectric device having first and second opposed surfaces and a peripheral edge extending therebetween, comprising:
    clamping the piezoelectric device by engaging the opposed first and second surfaces of the piezoelectric device proximate the peripheral edge;
    applying a clamping force to the piezoelectric device; and
    varying the applied clamping force in response to changes in temperature proximate the piezoelectric device.

17. The method of claim 16 further comprising increasing the applied clamping force to the piezoelectric device in response to an increase in temperature proximate the piezoelectric device.

18. The method of claim 16 further comprising decreasing the applied clamping force to the piezoelectric device in response to a decrease in temperature proximate the piezoelectric device.

19. A method for providing temperature compensation of a piezoelectric device having first and second opposed surfaces and a peripheral edge extending therebetween, comprising:
    engaging the first surface of the piezoelectric device with a first clamping member;
    engaging the second surface of the piezoelectric device with a second clamping member; and
    moving the first and second clamping members relative to each other to apply a clamping force to the piezoelectric device that varies with changes in temperature proximate the piezoelectric device.

20. The method of claim 19 wherein engaging the first surface of the piezoelectric device comprises engaging the first surface of the piezoelectric device with the first clamping member proximate the peripheral edge.

21. The method of claim 19 wherein engaging the second surface of the piezoelectric device comprises engaging the second surface of the piezoelectric device with the second clamping member proximate the peripheral edge.

* * * * *